United States Patent
Chung et al.

(10) Patent No.: US 9,450,103 B2
(45) Date of Patent: Sep. 20, 2016

(54) THIN FILM TRANSISTOR, METHOD FOR MANUFACTURING THE SAME, DISPLAY DEVICE AND ELECTRONIC PRODUCT

(71) Applicants: BOE TECHNOLOGY GROUP CO., LTD., Beijing (CN); CHONGQING BOE OPTOELECTRONICS CO., LTD., Chongqing (CN)

(72) Inventors: Jaemoon Chung, Beijing (CN); Inchul Choi, Beijing (CN); Xinghua Cui, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 14/419,619

(22) PCT Filed: Apr. 16, 2014

(86) PCT No.: PCT/CN2014/075504
§ 371 (c)(1),
(2) Date: Feb. 4, 2015

(87) PCT Pub. No.: WO2015/100879
PCT Pub. Date: Jul. 9, 2015

(65) Prior Publication Data
US 2016/0027919 A1      Jan. 28, 2016

(30) Foreign Application Priority Data
Dec. 31, 2013   (CN) .......................... 2013 1 0752923

(51) Int. Cl.
*H01L 29/49*     (2006.01)
*H01L 29/786*    (2006.01)
(Continued)

(52) U.S. Cl.
CPC ....... *H01L 29/7869* (2013.01); *H01L 27/1214* (2013.01); *H01L 29/1033* (2013.01); *H01L 29/66969* (2013.01); *H01L 29/78696* (2013.01)

(58) Field of Classification Search
CPC .......... H01L 29/7869; H01L 27/1214; H01L 29/1033; H01L 29/66969; H01L 29/78696
See application file for complete search history.

(56) References Cited

U.S. PATENT DOCUMENTS

2006/0071211 A1* 4/2006 Lee ......................... H01L 27/12
257/59
2008/0299702 A1* 12/2008 Son ..................... H01L 29/7869
438/104

(Continued)

FOREIGN PATENT DOCUMENTS

CN     102522411 A     6/2012
CN     103365007 A     10/2013

(Continued)

OTHER PUBLICATIONS

First Office Action regarding Chinese application No. 201310752923.8, dated Aug. 6, 2015. Translation provided by Dragon Intellectual Property Law Firm.
(Continued)

*Primary Examiner* — Michael Shingleton
(74) *Attorney, Agent, or Firm* — Harness, Dickey & Pierce, P.L.C.

(57) ABSTRACT

A thin film transistor (TFT) according to the present disclosure may include an active layer, an etch stop layer (ESL), a source electrode and a drain electrode. The active layer may include at least one first active portion, a second active portion and a third active portion located on both sides of the first active portion and connected to the first active portion. The at least one first active portion may be overlaid by the ESL, and a longitudinal width of the at least one first active portion may be less than those/that of the second active portion and/or the third active portion. The second active portion and the third active portion may be overlaid by a horizontally-extending portion of the ESL on the first active portion. A side wing contact may be formed between the second active portion and one electrode of the source electrode and the drain electrode, and/or a side wing contact may be formed between the third active portion and the other electrode of the source electrode and the drain electrode.

20 Claims, 14 Drawing Sheets

(51) Int. Cl.
  *H01L 29/66* (2006.01)
  *H01L 27/12* (2006.01)
  *H01L 29/10* (2006.01)

(56) References Cited

U.S. PATENT DOCUMENTS

| | | | | |
|---|---|---|---|---|
| 2012/0199891 A1* | 8/2012 | Suzuki | H01L 29/66969 | 257/288 |
| 2012/0256176 A1* | 10/2012 | Yang | H01L 29/41733 | 257/43 |
| 2013/0313530 A1* | 11/2013 | Seo | H01L 29/66969 | 257/40 |
| 2015/0028332 A1* | 1/2015 | Oda | H01L 29/41733 | 257/43 |
| 2015/0031168 A1* | 1/2015 | Shih | H01L 29/7869 | 438/104 |
| 2015/0034942 A1* | 2/2015 | Kim | H01L 29/7869 | 257/43 |
| 2015/0062475 A1* | 3/2015 | Kim | H01L 29/78648 | 349/43 |
| 2015/0102317 A1* | 4/2015 | Kim | H01L 29/7869 | 257/40 |
| 2015/0137113 A1* | 5/2015 | Yu | H01L 29/7869 | 257/43 |
| 2015/0179442 A1* | 6/2015 | Lee | H01L 29/66742 | 438/104 |
| 2015/0214375 A1* | 7/2015 | Hara | H01L 29/78606 | 257/43 |
| 2015/0243684 A1* | 8/2015 | Lee | H01L 27/1248 | 257/43 |
| 2015/0349140 A1* | 12/2015 | Wang | H01L 21/265 | 257/43 |
| 2016/0043116 A1* | 2/2016 | Sun | H01L 21/77 | 257/43 |

FOREIGN PATENT DOCUMENTS

| | | |
|---|---|---|
| CN | 103427023 A | 12/2013 |
| CN | 103715270 A | 4/2014 |
| KR | 20130032082 A | 4/2013 |

OTHER PUBLICATIONS

Written Opinion of the International Searching Authority for international application No. PCT/CN2014/075504.

\* cited by examiner

-PRIOR ART-

-PRIOR ART-

THIN FILM TRANSISTOR, METHOD FOR MANUFACTURING THE SAME, DISPLAY DEVICE AND ELECTRONIC PRODUCT

CROSS-REFERENCE TO RELATED APPLICATIONS

This application is the U.S. national phase of PCT Application No. PCT/CN2014/075504 filed on Apr. 16, 2014, which claims priority to Chinese Patent Application No. 201310752923.8 filed on Dec. 31, 2013, the disclosures of which are incorporated in their entirety by reference herein.

TECHNICAL FIELD

The present disclosure relates to the field of display technology, in particular to a thin film transistor, a method for manufacturing the same, a display device and an electronic product.

BACKGROUND

FIG. 1 is a diagram showing a process of a method for manufacturing a thin film transistor (TFT) having an etch stop layer (ESL) in the related art. The method includes:

Step S11, forming a gate electrode 102 and a gate insulating layer 103;

Step S12, forming a pattern of an active layer 104 on the gate insulating layer 103 by using a single patterning process;

Step S12 may specifically include: forming a metal oxide semiconductor thin film on the gate insulating layer 103; then coating a photoresist on the metal oxide semiconductor thin film; next, exposing and developing the photoresist to form the pattern of the active layer 104; and then peeling off the remained photoresist;

Step S13, forming a pattern of an ESL 105 on the active layer 104 by using a single patterning process;

Step S13 may specifically include: forming an ESL thin film on the active layer 104; then coating a photoresist on the ESL thin film; next, exposing and developing the photoresist to form the pattern of the ESL 105; and then peeling off the remained photoresist;

Step S14, forming two contact holes 106 which are configured to connect the active layer 104 and a source electrode/drain electrode formed subsequently, on the ESL 105;

Step S15, forming the source electrode 107 and the drain electrode 108 having an interval L therebetween on the ESL 105 by using a single patterning process.

FIG. 2 is a diagram showing a structure of an oxide TFT prepared by the method as shown in FIG. 1.

An interval L0 between the two contact holes 106 is referred to a channel length of a TFT. When the interval between the two contact holes 106 is arranged, an overlay tolerance between the contact holes 106 and the source electrode 107/the drain electrode 108 as well as a resolution error of a photo process need to be considered. In other words, a resolution error of a common exposure machine (typically 4 μm), a design length (typically 3 μm) and an overlay tolerance (typically 3 μm) need to be considered. At this circumstance, the channel length L0 is of about 10 μm, which is about 2.5 times of a channel length of a back channel etching (BCE) type TFT. A large channel length is one of the major causes of lowering the performance of a TFT.

SUMMARY

Technical Problems to be Solved

In view of the above, the present disclosure provides a thin film transistor, a method for manufacturing the same and a display device, to solve the problem that a channel length of a conventional thin film transistor having an ESL structure is large.

Technical Solutions

To solve the above technical problems, an embodiment of the present disclosure provides a thin film transistor (TFT), including: an active layer, an etch stop layer (ESL), a source electrode and a drain electrode, wherein the active layer includes: at least one first active portion, a second active portion and a third active portion located on both sides of the first active portion and connected to the first active portion;

the at least one first active portion is overlaid by the ESL, and a longitudinal width of the at least one first active portion is less than those/that of the second active portion and/or the third active portion;

the second active portion and the third active portion are partially overlaid by a horizontally-extending portion of the ESL on the first active portion;

a side wing contact is formed between the second active portion and one electrode of the source electrode and the drain electrode, and/or a side wing contact is formed between the third active portion and the other electrode of the source electrode and the drain electrode.

Alternatively, when the longitudinal width of the first active portion is less than that of the second active portion, the side wing contact may be formed between the second active portion and the source electrode; and when the longitudinal width of the first active portion is less than that of the third active portion, the side wing contact may be formed between the third active portion and the drain electrode.

Alternatively, when the side wing contact is formed between the second active portion and the source electrode, the second active portion may include: a first overlay portion which is overlaid by the ESL, and a first side wing portion which is not overlaid by the ESL and located in a longitudinal direction of the first overlay portion, wherein the side wing contact is formed between the second active portion and the source electrode through the first side wing portion; and when the side wing contact is formed between the third active portion and the drain electrode, the third active portion may include: a second overlay portion overlaid by the ESL, and a second side wing portion which is not overlaid by the ESL and located in a longitudinal direction of the second overlay portion, wherein the side wing contact is formed between the third active portion and the drain electrode through the second side wing portion.

Alternatively, the second active portion may further include: an extending portion which is not overlaid by the ESL and located in a horizontal direction of the first overlay portion.

Alternatively, the third active portion may further include: an extending portion which is not overlaid by the ESL and located in a horizontal direction of the second overlay portion.

Alternatively, when the active layer includes one first active portion, the first active portion may be located at an intermediate position of an area between the second active portion and the third active portion.

Alternatively, when the side wing contact is formed between the second active portion and the source electrode, the second active portion may include two first side wing portions and one first overlay portion, wherein the two first side wing portions are located on both sides of the first overlay portion; and when the side wing contact is formed between the third active portion and the drain electrode, the third active portion may include two second side wing portions and one second overlay portion, wherein the two second side wing portions are located on both sides of the second overlay portion.

Alternatively, when the active layer includes two first active portions, the two first active portions may be located on both upper and lower sides of an area between the second active portion and the third active portion.

Alternatively, when the side wing contact is formed between the second active portion and the source electrode, the second active portion may include one second side wing portion and two first overlay portions, wherein the second side wing portion is located between the two first overlay portions; and when the side wing contact is formed between the third active portion and the drain electrode, the second active portion may include one second side wing portion and two first overlay portions, wherein the second side wing portion is located between the two first overlay portions.

Alternatively, the thin film transistor may further include: a gate electrode and a gate insulating layer overlaid on the gate electrode; and wherein the active layer is formed on the gate insulating layer.

Alternatively, the thin film transistor may further include a passivation layer; and wherein the passivation layer is formed on the source electrode and the drain electrode.

Alternatively, the active layer may be made of a metal oxide semiconductor material.

Alternatively, shapes of the second active portion and the third active portion may be rectangular, circular or oval.

Another embodiment of the present disclosure further provides a method for manufacturing a thin film transistor (TFT), including:

forming an active layer and an etch stop layer (ESL), wherein the active layer includes at least one first active portion, and a second active portion and a third active portion located on both sides of the first active portion and connected to the first active portion; the at least one first active portion is overlaid by the ESL, and a longitudinal width of the at least one first active portion is less than those/that of the second active portion and/or the third active portion; the second active portion and the third active portion are partially overlaid by a horizontally-extending portion of the ESL on the first active portion; and forming a source electrode and a drain electrode, wherein a side wing contact is formed between the second active portion and one electrode of the source electrode and the drain electrode, and/or a side wing contact is formed between the third active portion and the other electrode of the source electrode and the drain electrode.

Alternatively, the side wing contact may be formed between the second active portion and the source electrode, when the longitudinal width of the first active portion is less than that of the second active portion; and the side wing contact may be formed between the third active portion and the drain electrode, when the longitudinal width of the first active portion is less than that of the third active portion.

Alternatively, a single patterning process is used in the step of forming the active layer and the ESL.

Alternatively, the step of forming the active layer and the ESL by using the single patterning process may include:

forming a metal oxide semiconductor thin film and an ESL thin film;

coating a photoresist on the ESL thin film;

exposing and developing the photoresist by using a halftone mask plate to form a photoresist-totally-remained area, a photoresist-half-remained area and a photoresist-removed area, wherein the photoresist-totally-remained area corresponds to an ESL pattern area, the photoresist-half-remained area corresponds to an area other than the ESL pattern area on the active layer, and the photoresist-removed area corresponds to an area other than the photoresist-totally-remained area and the photoresist-half-remained area;

removing the ESL thin film and the metal oxide semiconductor thin film in the photoresist-removed area by using an etching process, to form the active layer;

removing the photoresist in the photoresist-half-remained area by using an ashing process;

removing the ESL thin film in the photoresist-half-remained area by using an etching process to form a pattern of the ESL; and peeling off the photoresist in the photoresist-totally-remained area to form the ESL and the active layer.

Alternatively, a single patterning process may be used in the step of forming the source electrode and the drain electrode.

Alternatively, the step of forming the source electrode and drain electrode by using the single patterning process may include:

forming a source/drain electrode metal thin film on the active layer and the ESL;

coating a photoresist on the source/drain electrode metal thin film;

exposing and developing the photoresist on the source/drain electrode metal thin film to form a photoresist-remained area corresponding to source/drain electrode pattern areas and a photoresist-removed area which is an area except the photoresist-remained area;

removing the source/drain electrode metal thin film in the photoresist-removed area and a fourth active portion of the active layer by using an etching process, to form patterns of the source electrode, drain electrode and the active layer; wherein the fourth active portion of the active layer refers to a portion which is not overlaid by the ESL and not overlaid by the source electrode and the drain electrode; and peeling off the photoresist in the photoresist-remained area, to form the source electrode and the drain electrode.

Yet another embodiment of the present disclosure further provides a display device, at least including a base substrate and the above thin film transistors which are formed on the base substrate.

Another embodiment of the present disclosure further provides an electronic product, at least including the above display device.

It can be seen that, in the thin film transistor according to an embodiment of the present disclosure, the formed active layer includes: at least one first active portion, a second active portion and a third active portion located on both sides of the first active portion and connected to the first active portion. The at least one first active portion is overlaid by the ESL, and a longitudinal width of the at least one first active portion is less than those/that of the second active portion and/or the third active portion. The second active portion and the third active portion are partially overlaid by a horizontally-extending portion of the ESL on the first active portion. For example, a side wing contact is formed between the second active portion and the source electrode, and/or a side wing contact is formed between the third active portion and the drain electrode.

The Beneficial Effects

Embodiments of the present disclosure at least have the following advantages.

According to the present disclosure, it is not required to fin n the contact holes configured to connect the active layer and the source/drain electrodes on the ESL, which can avoid problems that exist in the overlay tolerance between the contact holes and source/drain electrodes during the preparing process in the related art. Therefore, the channel length of the oxide TFT is reduced, and a fine and delicate channel is formed and further, the Ion current of the oxide TFT is improved, thereby improving the performance of the oxide TFT.

BRIEF DESCRIPTION OF THE DRAWINGS

In order to more clearly illustrate the technical solutions of the present disclosure or the related art, the drawings desired for the present disclosure or the related art will be briefly described below. Apparently, the following drawings merely relate to some embodiments of the present disclosure, and other drawings may also be obtained by a person skilled in the art based on these drawings without any creative work.

DETAILED DESCRIPTION

Figure 1:
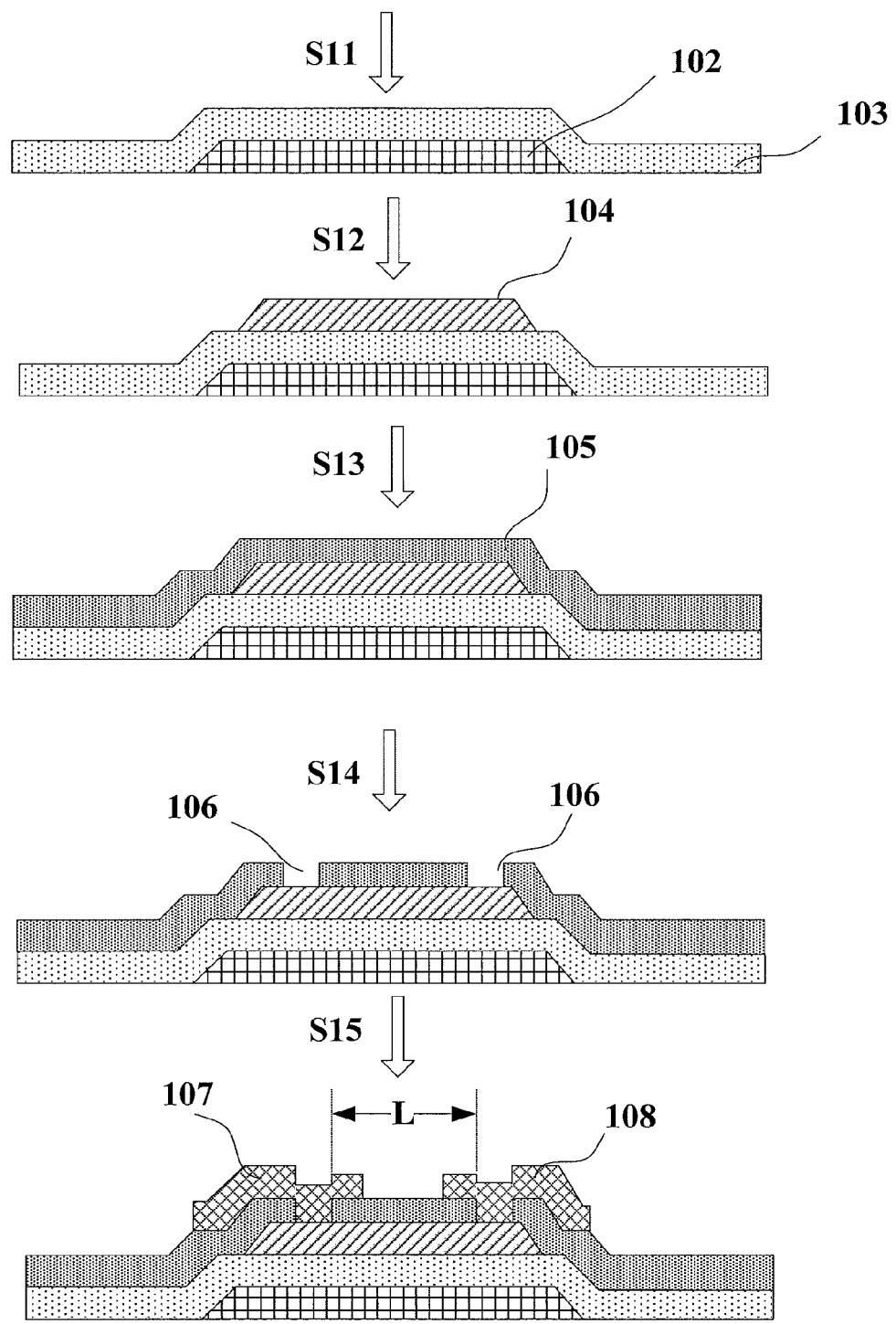
FIG. 1 is a diagram showing a process of a method for manufacturing a thin film transistor (TFT) having an etch stop layer (ESL) in the related art.

Embodiments of the present disclosure will be further described below in conjunction with the accompanying drawings and examples. The following embodiments are merely used to illustrate the present disclosure, but not intended to limit the scope of the present invention.

In order to make the objects, technical solutions and advantages of the embodiments of the present disclosure more clear, the technical solutions according to the embodiments of the present disclosure will be clearly and fully described hereinafter in conjunction with the accompanying drawings in the embodiments of the present disclosure. Obviously, the described embodiments are merely parts of embodiments of the present disclosure, but not all the embodiments. Based on the embodiments in the present disclosure, all the other embodiments obtained by a person skilled in the art will fall within the protection scope of the present disclosure.

Unless otherwise defined, technical terms or scientific terms used herein shall have the general meaning which can be understood by a person skilled in the art. The terms, "a" or "an" or the like, do not mean quantitative restrictions, but rather indicate the presence of at least one. Similarly, the term, "include" or "contain" or the like, mean that the elements or objects before the term "include" or "contain" includes the elements or objects behind the term "include" or "contain" and do not exclude other elements or objects. The terms "connect" or "couple" or the like are not limited to connect physically or mechanically, but may include connecting electrically either directly or indirectly. The terms "up", "down", "left", "right", etc., are merely used to indicate a relative positional relationship; when the absolute position of the described object is changed, the relative positional relationship is changed correspondingly. The term "longitudinal" refers to a vertical direction, and the term "horizontal" refers to a left-right direction. The terms "longitudinal" and "horizontal" are only used to indicate the relative directions; when an absolute direction of the described object is changed, the relative directions may be changed correspondingly.

An embodiment of the present disclosure provides a thin film transistor (TFT), including an active layer, an etch stop layer (ESL), a source electrode and a drain electrode.

The active layer includes: at least one first active portion, a second active portion and a third active portion located on both sides of the first active portion and connected to the first active portion. The at least one first active portion is overlaid by the ESL, and a longitudinal width of the at least one first active portion is less than those/that of the second active portion and/or the third active portion. For example, the first active portion is not located on areas corresponding to the source electrode and the drain electrode; the second active portion is located on an area corresponding to the source electrode; and the third active portion is located on an area corresponding to the drain electrode. The second active portion and the third active portion are partially overlaid by a horizontally-extending portion of the ESL on the first active portion. When the longitudinal width of the first active portion is less than that of the second active portion, a side wing contact is formed between the second active portion and the source electrode; and when the longitudinal width of the first active portion is less than that of the third active portion, a side wing contact is formed between the third active portion and the drain electrode.

That is, the side wing contact may be only formed between the active layer and the source electrode, or may be only formed between the active layer and the drain electrode, or may be formed both between the active layer and the source electrode and between the active layer and the drain electrode.

In the above structure, with a partial protection of the ESL, a partly non-overlaid area is formed on the active layer, so that the side wing contact is formed between the active layer and the source/drain electrode. Therefore, there is no need to form the contact holes, which are configured to connect the active layer and the source/drain electrode, on the ESL, which can avoid the overlay tolerance between the contact holes and the source/drain electrode during the preparing process in the related art. At the same time, the channel length of the oxide TFT is reduced, a fine and delicate channel is formed and further, the Ion current of the oxide TFT is improved, thereby improving the performance of the oxide TFT.

The structure of the side wing contact in the above embodiment will be described below in detail.

When the side wing contact is formed between the second active portion and the source electrode, the second active portion may include: a first overlay portion which is overlaid by the ESL, and a first side wing portion which is not overlaid by the ESL and located in a longitudinal direction of the first overlay portion, thus the side wing contact is formed between the second active portion and the source electrode through the first side wing portion.

When the side wing contact is formed between the third active portion and the drain electrode, the third active portion may include: a second overlay portion overlaid by the ESL, and a second side wing portion which is not overlaid by the ESL and located in a longitudinal direction of the second overlay portion, thus the side wing contact is formed between the third active portion and the drain electrode through the second side wing portion.

In order to make the above objects, features and advantages of the present disclosure more clear, descriptions in detail will be given hereinafter in conjunction with the accompanying drawings and embodiments of the present disclosure.

First Embodiment

Figure 3:
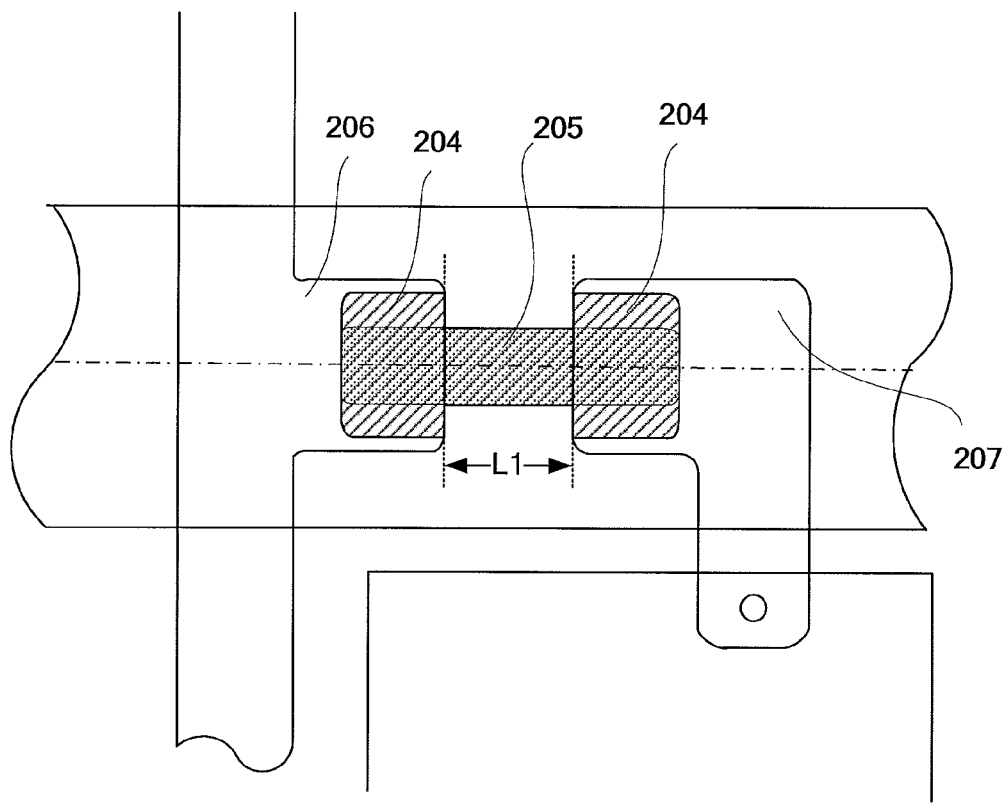
FIG. 3 is a diagram showing a structure of a TFT according to a first embodiment of the present disclosure.

FIG. 3 is a diagram showing a structure of a TFT according to this embodiment. The TFT includes an active layer 204, an ESL 205, a source electrode 206 and a drain electrode 207.

Figure 4:
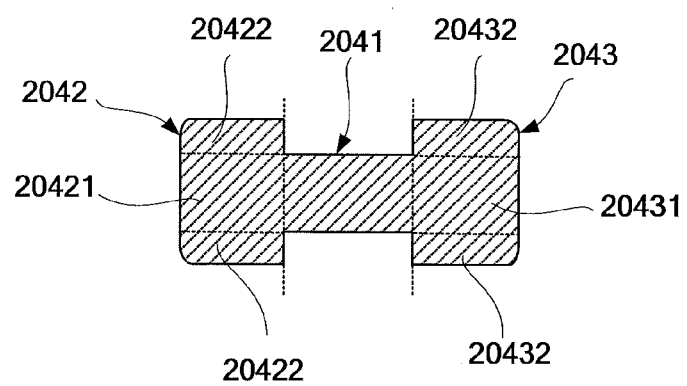
FIG. 4 is a diagram showing a structure of an active layer according to the first embodiment of the present disclosure.

FIG. 4 is a diagram showing a structure of an active layer according to this embodiment. The active layer 204 includes: one first active portion 2041, a second active portion 2042 and a third active portion 2043 located on both sides of the first active portion 2041 and connected to the first active portion 2041.

The first active portion 2041 is overlaid by the ESL 205, and a longitudinal width of the first active portion 2041 is less than those of the second active portion 2042 and the third active portion 2043. Here, as show in FIG. 4, the term "longitudinal" is referred to a vertical direction in the diagram; while the term "horizontal" is referred to a transverse (left-right) direction. It is obvious that, both the horizontal direction and longitudinal direction are relative directions. When an absolute direction of a target object is changed, the relative directions may be changed correspondingly. The first active portion 2041 is not located on areas corresponding to the source electrode 206 and the drain electrode 207.

For example, the second active portion 2042 may be located on an area corresponding to the source electrode 206 and the third active portion 2043 may be located on an area corresponding to the drain electrode 207. It is obvious that, the second active portion 2042 may be located on an area corresponding to the drain electrode 207 and the third active portion 2043 may be located on an area corresponding to the source electrode 206. The present disclosure will not be limited thereto. The second active portion 2042 and the third active portion 2043 are overlaid by the horizontally-extending portion of the ESL 205 on the first active portion 2041.

The second active portion 2042 includes a first overlay portion 20421 overlaid by the ESL 205, and a first side wing portion 20422, which is not overlaid by the ESL 205 and located in a longitudinal direction of the first overlay portion 20421, thus the side wing contact is formed between the second active portion 2042 and the source electrode 206 through the first side wing portion 20422.

The third active portion 2043 includes: a second overlay portion 20431 overlaid by the ESL 205, and a second side wing portion 20432 which is not overlaid by the ESL 205 and located in a longitudinal direction of the second overlay portion 20431, thus the side wing contact is formed between the third active portion 2043 and the drain electrode 207 through the second side wing portion 20432.

Furthermore, it can be seen from FIG. 4 that, the first active portion 2041 is located at an intermediate position of an area between the second active portion 2042 and the third active portion 2043. The second active portion 2042 includes two first side wing portions 20422 and one first overlay portion 20421. The two first side wing portions 20422 are located on both sides of the first overlay portion 20421. At the same time, the third active portion 2043 includes two second side wing portion 20432 and one second overlay area 20431. The two second side wing portions 20432 are located on both sides of the second overlay portion 20431.

Figure 2:
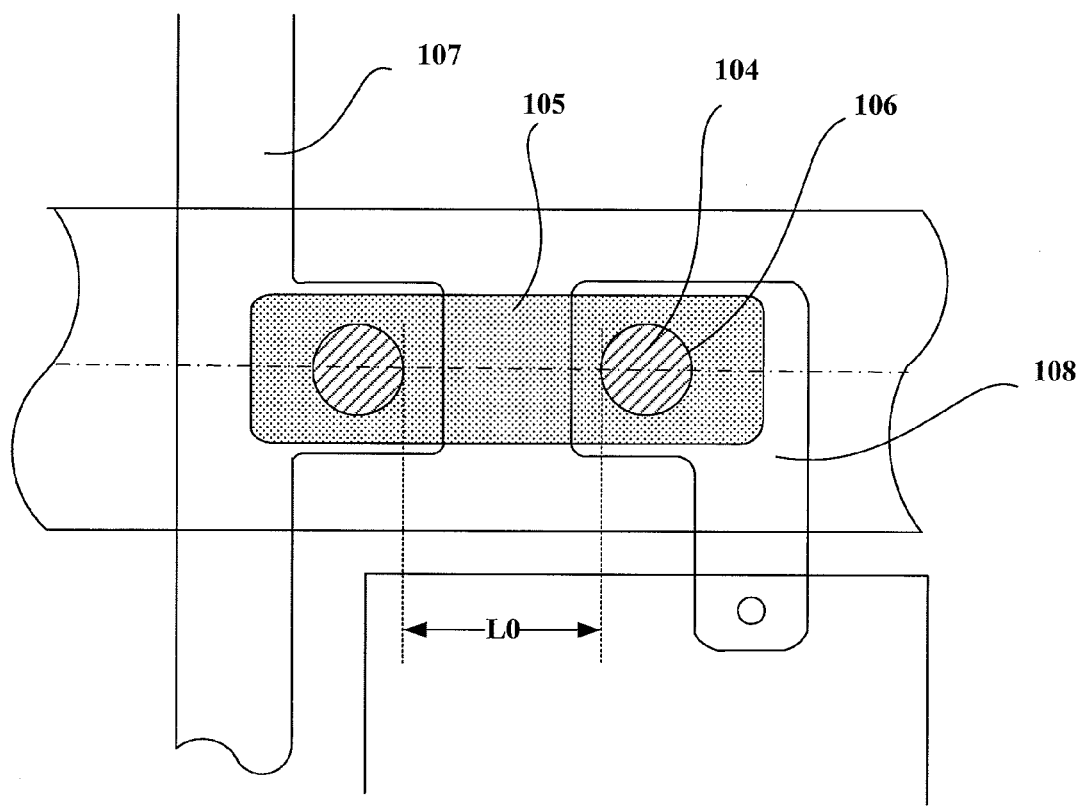
FIG. 2 is a diagram showing a structure of an oxide TFT prepared by the method as shown in FIG. 1.

Referring to FIG. 3, in this embodiment, because of using the side wing contact, a channel length L1 between the source electrode 206 and the drain electrode 207 is much less than a channel length L0 between the source electrode and the drain electrode which are connected by contact holes in the related art (see FIG. 2).

In this embodiment, side wing contacts are formed both between the active layer 204 and the source electrode 206 and between the active layer 204 and the drain electrode 207. In another embodiment of the present disclosure, a side wing contact may be formed only between the active layer 204 and the source electrode 206 or may be formed only between the active layer 204 and the drain electrode 207.

Second Embodiment

Figure 5:
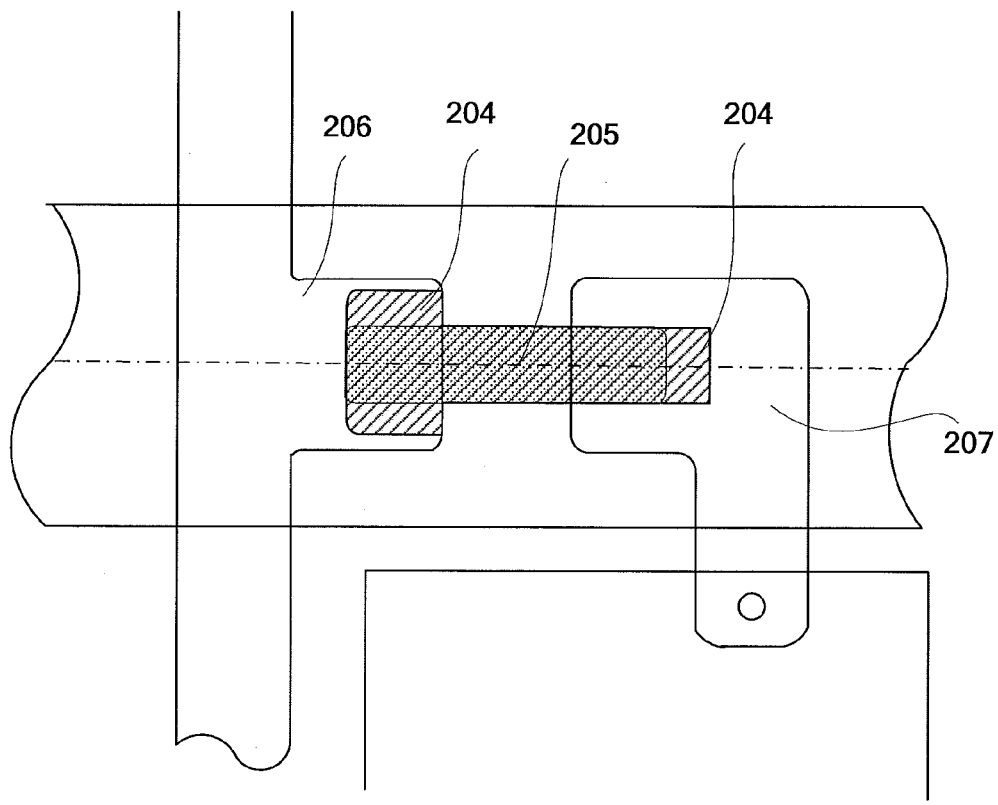
FIG. 5 is a diagram showing a structure of a TFT according to a second embodiment of the present disclosure.
Figure 6:
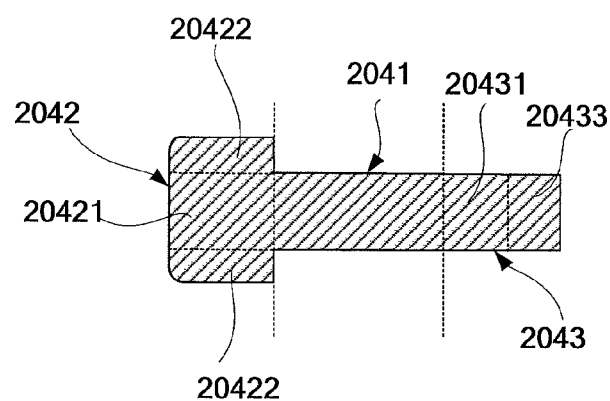
FIG. 6 is a diagram showing a structure of an active layer according to the second embodiment of the present disclosure.

FIG. 5 is a diagram showing a structure of a TFT according to the second embodiment of the present disclosure. FIG. 6 is a diagram showing a structure of an active layer according to the second embodiment of the present disclosure. It can be seen from FIG. 5 and FIG. 6 that, the difference between the TFT of the second embodiment and that of the first embodiment is that, the third active portion 2043 does not include the second side wing portion 20432. That is, the side wing contact is formed only between the active layer 204 and the source electrode 206 and not formed between the active layer 204 and the drain electrode 207.

Specifically, the third active portion 2043 includes the second overlay portion 20431 overlaid by the ESL 205, and an extending portion 20433 which is not overlaid by the ESL 205 and located in a horizontal direction of the second overlay portion 20431. Thus, the third active portion 2043 is contacted with the drain electrode 207 through the extending portion 20433.

It is obvious that, in other embodiments of the present disclosure, the side wing contact may be only formed between the active layer 204 and the drain electrode 207, which will not be described in detail herein.

Third Embodiment

Figure 7:
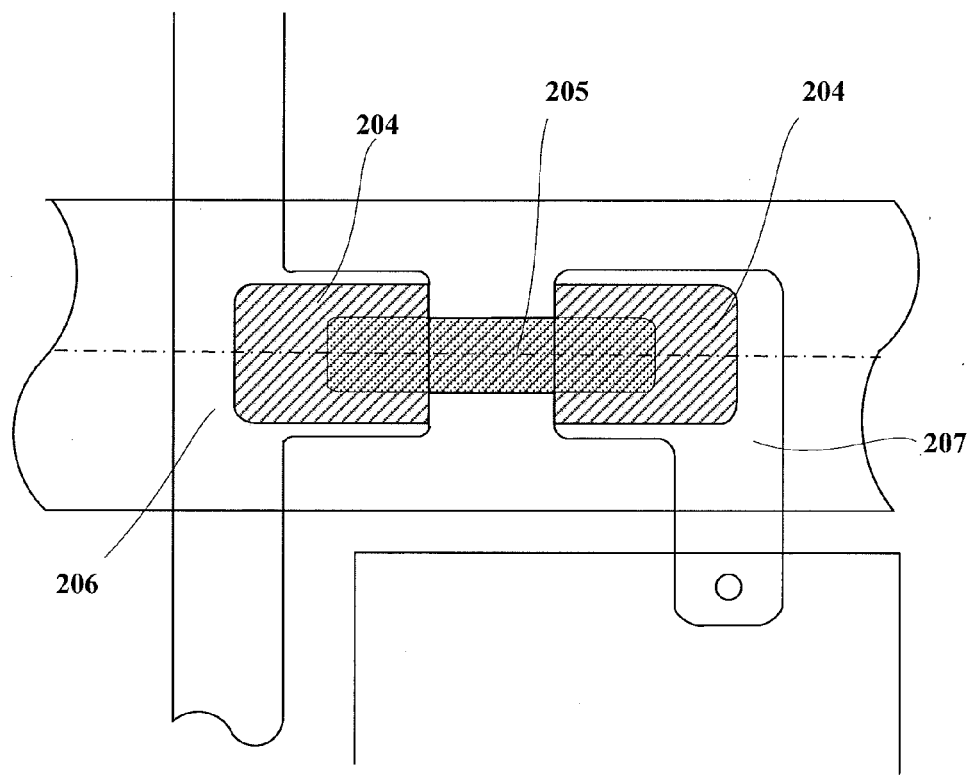
FIG. 7 is a diagram showing a structure of a TFT according to a third embodiment of the present disclosure.
Figure 8:
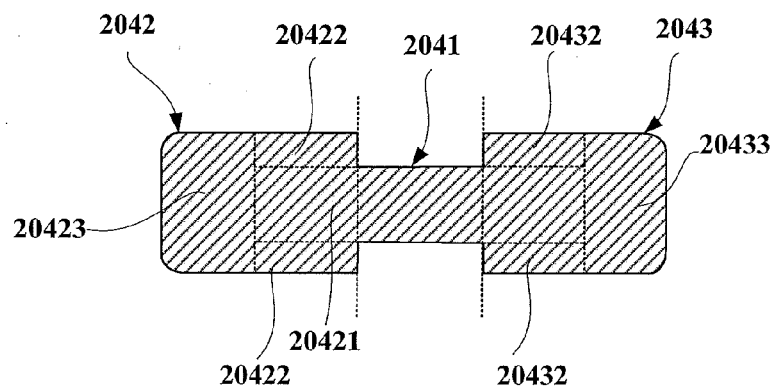
FIG. 8 is a diagram showing a structure of an active layer according to the third embodiment of the present disclosure.

FIG. 7 is a diagram showing a structure of a TFT according to the third embodiment of the present disclosure. FIG. 8 is a diagram showing a structure of an active layer according to the third embodiment of the present disclosure. It can be seen from FIG. 7 and FIG. 8 that, the difference between the TFT of the third embodiment and that of the first embodiment is that, in addition to the first overlay portion 20421 and the first side wing portion 20422, the second active portion 2042 further includes an extending portion 20423 which is not overlaid by the ESL 205 and located in a horizontal direction of the first overlay portion 20421. The extending portion 20423 is also contacted with the source electrode 206.

Moreover, in addition to the second overlay portion 20431 and the second side wing portion 20432, the third active portion 2043 further includes an extending portion 20433 which is not overlaid by the ESL 205 and located in a horizontal direction of the second overlay portion 20431. The extending portion 20433 is also contacted with the drain electrode 207.

In this embodiment, both the second active portion 2042 and the third active portion 2043 include the extending portion. It is obvious that in another embodiment of the present disclosure, maybe only one active portion of the second active portion 2042 and the third active portion 2043 includes the extending portion, and the other one does not include the extending portion. The specific structures will not be described in detail herein.

Fourth Embodiment

Figure 9:
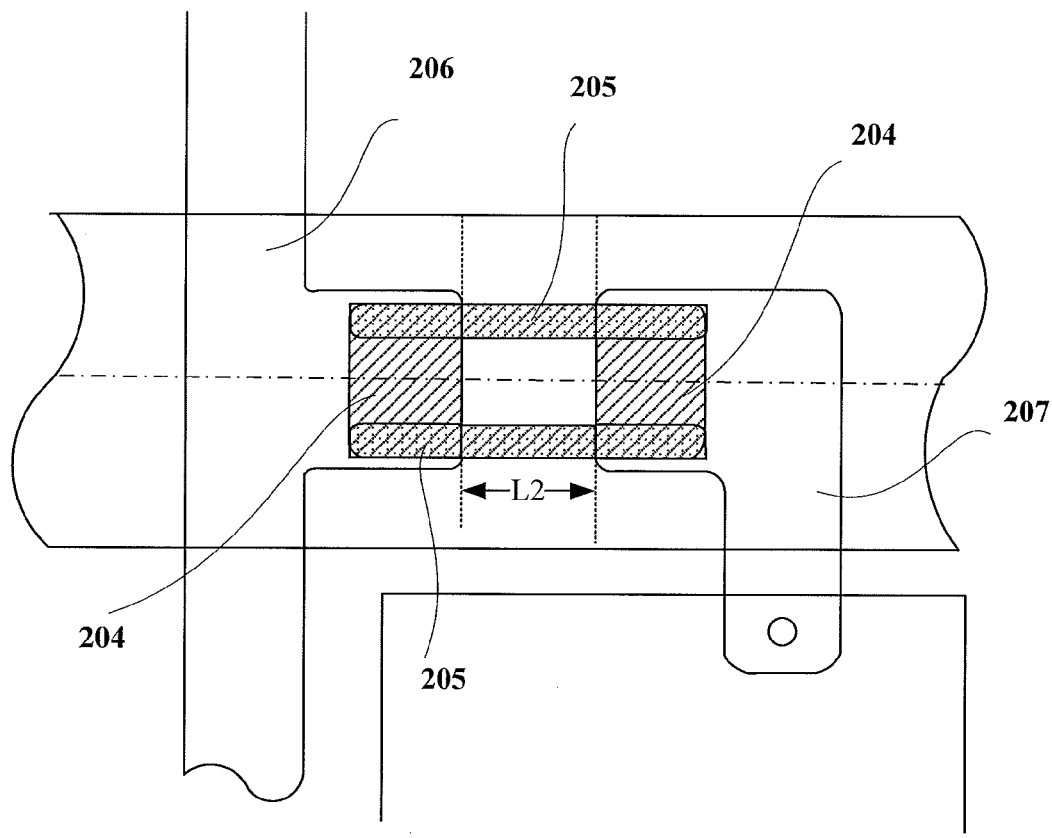
FIG. 9 is a diagram showing a structure of a TFT according to a fourth embodiment of the present disclosure.

FIG. 9 is a diagram showing a structure of a TFT according to the fourth embodiment of the present disclosure. The TFT includes an active layer 204, an ESL 205, a source electrode 206 and a drain electrode 207.

Figure 10:
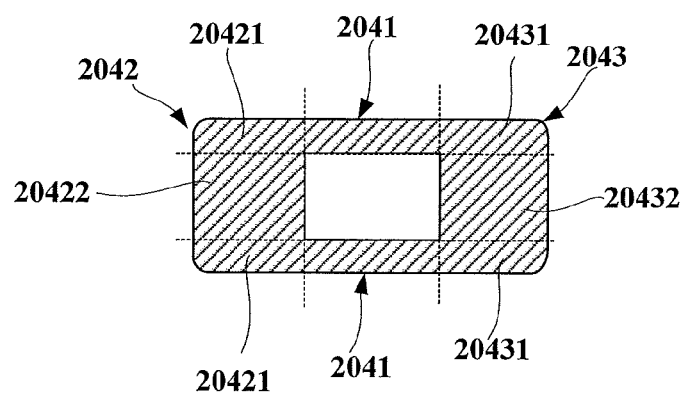
FIG. 10 is a diagram showing a structure of an active layer according to the fourth embodiment of the present disclosure.

FIG. 10 is a diagram showing a structure of an active layer according to the fourth embodiment of the present disclosure. The active layer 204 includes two first active portions 2041, and a second active portion 2042 and a third active portion 2043 which are located on both sides of the first active portion 2041 and connected to the first active portion 2041.

The first active portion 2041 is overlaid by the ESL 205, and a longitudinal width of the first active portion 2041 is less than those of the second active portion 2042 and the third active portion 2043. The first active portion 2041 is not located on areas corresponding to the source electrode 206 and the drain electrode 207.

For example, the second active portion 2042 may be located on an area corresponding to the source electrode 206 and the third active portion 2043 may be located on an area corresponding to the drain electrode 207. The second active portion 2042 and the third active portion 2043 are overlaid by a horizontally-extending portion of the ESL 205 on the first active portion 2041.

The second active portion 2042, for example, includes: a first overlay portion 20421 overlaid by the ESL 205, and a first side wing portion 20422 which is not overlaid by the ESL 205 and located in a longitudinal direction of the first overlay portion 20421. The side wing contact is formed between the second active portion 2042 and the source electrode 206 through the first side wing portion 20422.

The third active portion 2043, for example, includes: a second overlay portion 20431 overlaid by the ESL 205, and a second side wing portion 20432 which is not overlaid by the ESL 205 and located in a longitudinal direction of the second overlay portion 20431. The side wing contact is formed between the third active portion 2043 and the drain electrode 207 through the second side wing portion 20432.

Furthermore, it can be seen from FIG. 10 that, the two first active portions 2041 are located on both upper and lower sides of an area between the second active portion 2042 and the third active portion 2043. The second active portion 2042 includes one first side wing portion 20422 and two first overlay portions 20421. The two first overlay portions 20421 are located on both sides of the first side wing portion 20422. At the same time, the third active portion 2043 includes one second side wing portion 20432 and two second overlay portion 20431. The two second overlay portions 20431 are located on both sides of the second side wing portion 20432.

Referring to FIG. 9, in this embodiment, because of using the side wing contact, a channel length L2 between the source electrode 206 and the drain electrode 207 is much less than a channel length L0 between the source electrode and the drain electrode which are connected by contact holes in the related art (see FIG. 2).

In this embodiment, side wing contacts are formed both between the active layer 204 and the source electrode 206 and between the active layer 204 and the drain electrode 207. It is obvious that in other embodiments of the present disclosure, a side wing contact may be formed only between the active layer 204 and the source electrode 206 or may be formed only between the active layer 204 and the drain electrode 207.

Fifth Embodiment

Figure 11:
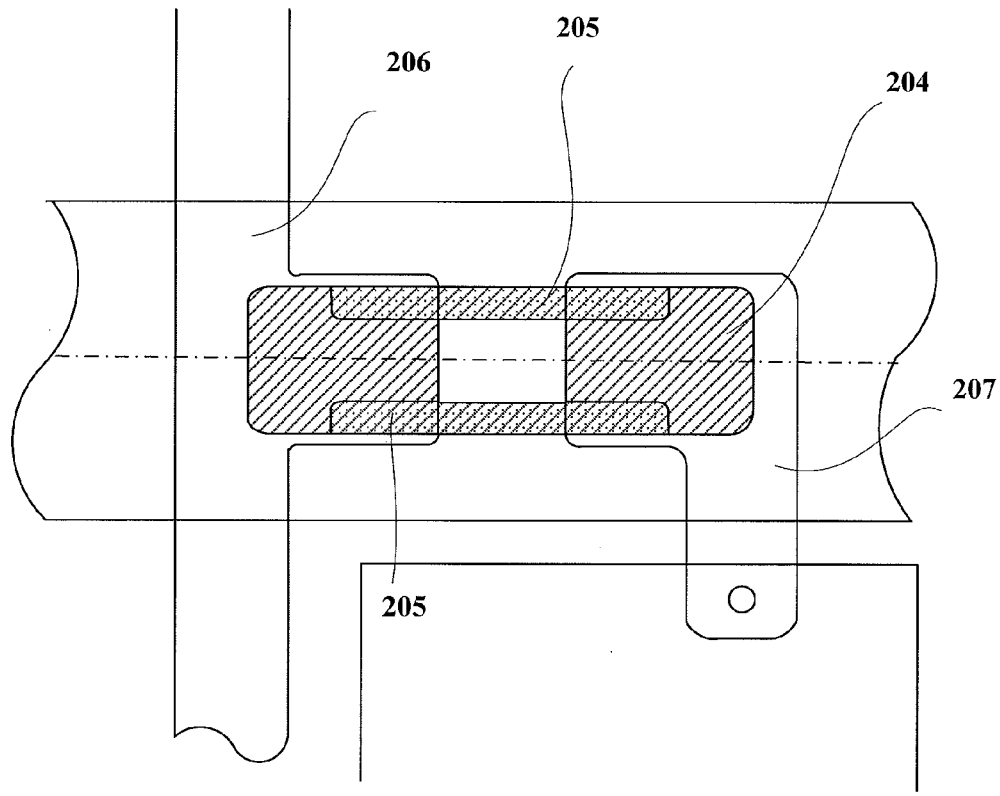
FIG. 11 is a diagram showing a structure of a TFT according to a fifth embodiment of the present disclosure.
Figure 12:
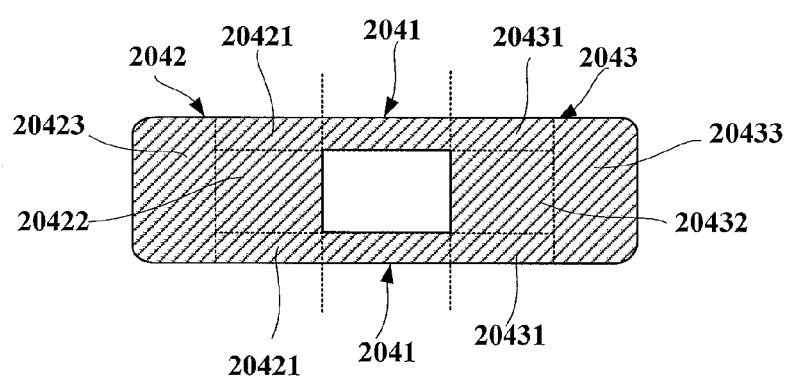
FIG. 12 is a diagram showing a structure of an active layer according to the fifth embodiment of the present disclosure.

FIG. 11 is a diagram showing a structure of a TFT according to this embodiment of the present disclosure. FIG. 12 is a diagram showing a structure of an active layer according to this embodiment of the present disclosure. It can be seen from FIG. 11 and FIG. 12 that, the difference between the TFT of the fifth embodiment and that of the fourth embodiment is that, in addition to the first overlay portion 20421 and the first side wing portion 20422, the second active portion 2042 further includes an extending portion 20423 which is not overlaid by the ESL 205 and located in a horizontal direction of the first overlay portion 20421. The extending portion 20423 is also contacted with the source electrode 206.

Moreover, in addition to the second overlay portion 20431 and the second side wing portion 20432, the third active portion 2043 further includes an extending portion 20433 which is not overlaid by the ESL 205 and located in a horizontal direction of the second overlay portion 20431. The extending portion 20433 is also contacted with the drain electrode 207.

In this embodiment, both the second active portion 2042 and the third active portion 2043 include the extending portion. It is obvious that in other embodiments of the present disclosure, maybe only one active portion of the second active portion 2042 and the third active portion 2043 includes the extending portion, and the other one does not include the extending portion. The specific structures will not be described in detail herein.

It can be seen from the above embodiment that:

when the active layer includes one first active portion, the first active portion is located on an intermediate position of an area between the second active portion and the third active portion. When the side wing contact is formed between the second active portion and the source electrode, the second active portion includes two first side wing portions and one first overlay portion, wherein the two first side wing portions are located on both sides of the first overlay portion. When the side wing contact is formed between the second active portion and the drain electrode, the third active portion includes two second side wing portions and one second overlay portion, wherein the two second side wing portions are located on both sides of the second overlay area.

In addition, when the active layer includes two first active portions, the two first active portions are located on both upper and lower sides of an area between the second active portion and the third active portion. When the side wing contact is formed between the second active portion and the source electrode, the second active portion includes one second side wing portion and two first overlay portions. The second side wing portion is located between the two first overlay portions. When the side wing contact is formed between the second active portion and the drain electrode, the second active portion includes one second side wing portion and two first overlay portions. And the second side wing portion is located between the two first overlay portions.

Sixth Embodiment and Seventh Embodiment

In each of the above embodiments, shapes of the second active portion and the third active portion are rectangular. However, the shapes of the second active portion and the third active portion are not limited thereto. The shapes of the second active portion and the third active portion may be circular, oval or other appropriate shapes.

Figure 13:
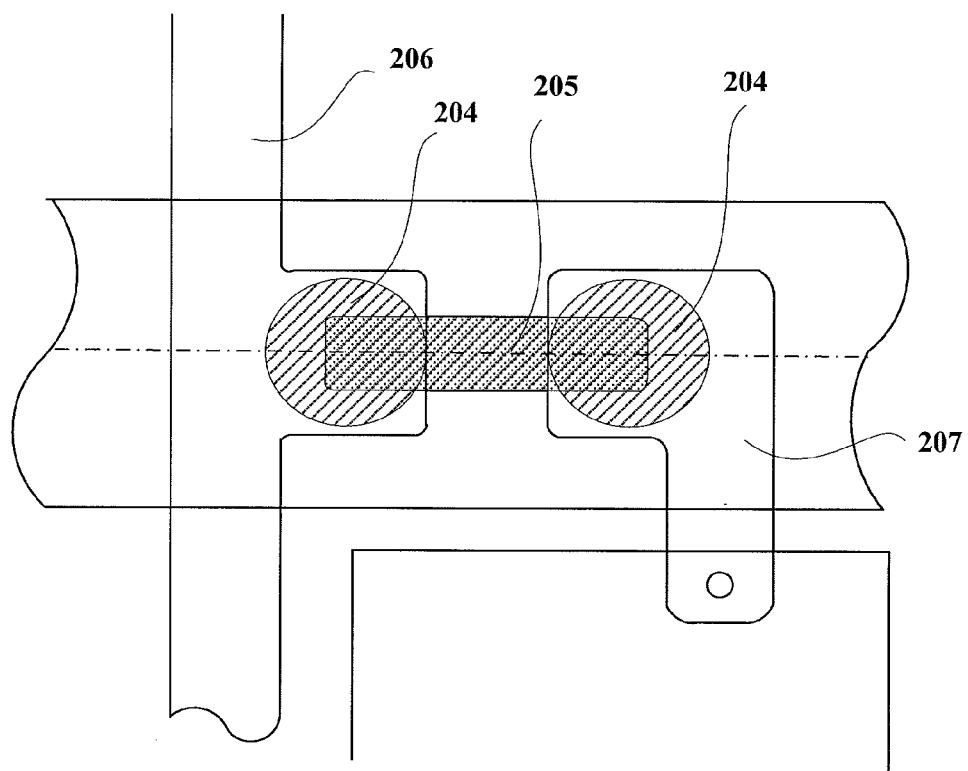
FIG. 13 is a diagram showing a structure of a TFT according to a sixth embodiment of the present disclosure.
Figure 14:
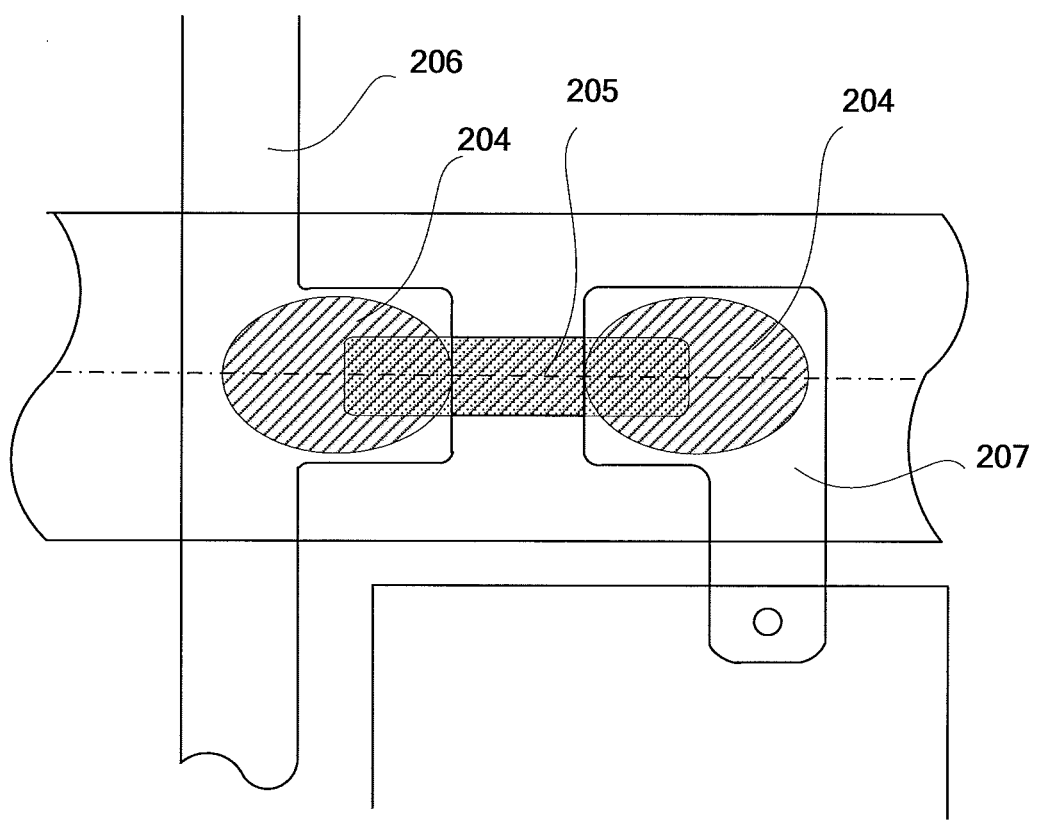
FIG. 14 is a diagram showing a structure of a TFT according to a seventh embodiment of the present disclosure.

FIG. 13 is a diagram showing a structure of a TFT according to the sixth embodiment of the present disclosure. In this embodiment, shapes of the second active portion and the third active portion are circular. FIG. 14 is a diagram showing a structure of a TFT according to the seventh embodiment of the present disclosure. In this embodiment, shapes of the second active portion and the third active portion are oval.

Moreover, in addition to the active layer, the ESL, the source electrode and the drain electrode, the TFT in any of the above embodiments may further include: a gate electrode and a gate insulating layer overlaying the gate electrode. Moreover, the active layer is formed on the gate insulating layer.

Furthermore, in order to protect the TFT, the TFT in any of the above embodiments may further include a passivation layer. Moreover, the passivation layer is formed on the source electrode and the drain electrode.

Eighth Embodiment

Figure 15:
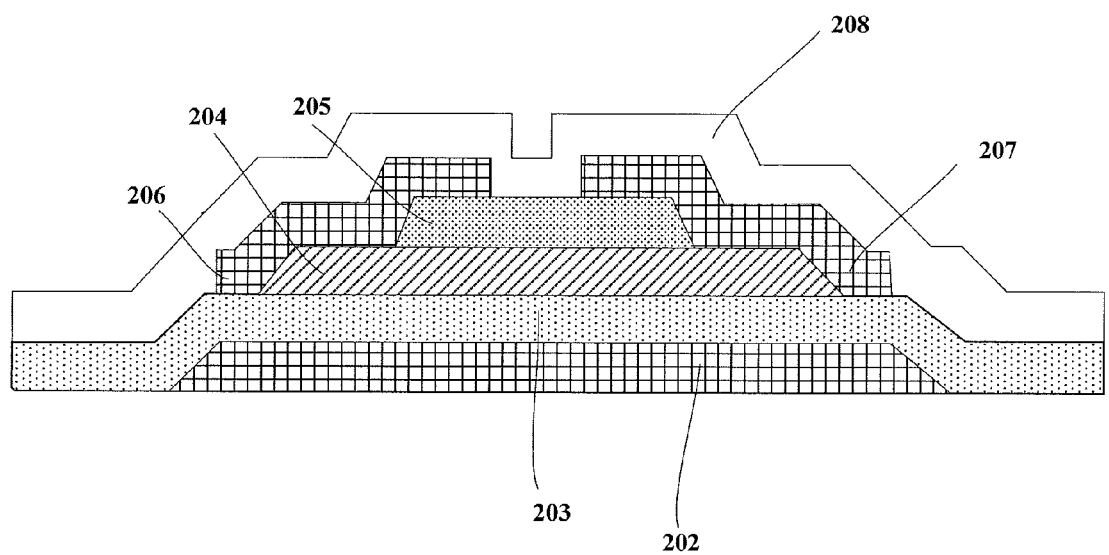
FIG. 15 is a diagram showing a structure of a TFT according to an eighth embodiment of the present disclosure.

FIG. 15 is a diagram showing a structure of a TFT according to this embodiment. The TFT includes:

a gate electrode 202;

a gate insulating layer 203 overlaying the gate electrode;

an active layer 204, which is formed on the gate insulating layer and may be the active layer 204 in any of the above embodiments;

an ESL 205 formed on the active layer 204;

a source electrode 206 and a drain electrode 207 formed on the ESL 205; and a passivation layer 208 formed on the source electrode 206 and a drain electrode 207.

In the above structure, with a partial protection of the ESL, a partly non-overlaid area is formed on the active layer, so that the side wing contact is formed between the active layer and the source/drain electrode. Therefore, there is no need to form the contact holes, which are configured to connect the active layer and the source/drain electrode on the ESL, which can avoid the overlay tolerance between the contact holes and the source/drain electrode during the preparing process in the related art. At the same time, the channel length of the oxide TFT is reduced, a fine and delicate channel is formed and further, the Ion current of the oxide TFT is improved, thereby improving the performance of the oxide TFT.

An embodiment of the present disclosure further provides a display device including the TFTs described above. The display device may be an array substrate, a display panel, a monitor and the like.

Another embodiment of the present disclosure further provides an electronic product. The electronic product may be, for example, liquid crystal panels, electronic papers, organic light-emitting diode (OLED) panels, liquid crystal TVs, liquid crystal displays, digital photo frames, mobile phones, tablet PCs and other products or components having display functions.

Moreover, with respect to the above TFTs, an embodiment of the present disclosure further provides a method for manufacturing the TFTs, including:

forming an active layer and an etch stop layer (ESL), wherein the active layer includes at least one first active portion, and a second active portion and a third active portion located on both sides of the first active portion and connected to the first active portion; the at least one first active portion is overlaid by the ESL, and a longitudinal width of the at least one first active portion is less than those/that of the second active portion and/or the third active portion; the second active portion and the third active portion are partially overlaid by a horizontally-extending portion of the ESL on the first active portion; and forming a source electrode and a drain electrode, wherein a side wing contact is formed between the second active portion and one electrode of the source electrode and the drain electrode, and/or a side wing contact is formed between the third active portion and the other electrode of the source electrode and the drain electrode.

Specifically, when the longitudinal width of the first active portion is less than that of the second active portion, the side wing contact is formed between the second active portion and the source electrode; and when the longitudinal width of the first active portion is less than that of the third active portion, the side wing contact is formed between the third active portion and the drain electrode.

Further, in the method, a single patterning process is used in the step of forming the active layer and the ESL.

The step of forming the active layer and the ESL by using the single patterning process may specifically include:

Step S21, forming a metal oxide semiconductor thin film and an ESL thin film.

Specifically, the metal oxide semiconductor thin film and the ESL thin film can be formed by using a depositing method at a time.

The metal oxide semiconductor may be, for example, an indium gallium zinc oxide (IGZO), a nano-indium tin oxide (ITO) or an indium zinc oxide (IZO) and the like.

Step S22, coating a photoresist on the ESL thin film.

Step S23, exposing and developing the photoresist by using a halftone mask plate to form a photoresist-totally-remained area, a photoresist-half-remained area and a photoresist-removed area. Here, the photoresist-totally-remained area corresponds to an ESL pattern area, the photoresist-half-remained area corresponds to an area other than the ESL pattern area on the active layer, and the photoresist-removed area corresponds to an area other than the photoresist-totally-remained area and the photoresist-half-remained area.

Step S24, removing the ESL thin film and the metal oxide semiconductor thin film in the photoresist-removed area by using an etching process, to form the active layer.

Specifically, a dry etch process can be used in the step of removing the ESL thin film in the photoresist-removed area.

Moreover, a wet etch process can be used in the step of removing the metal oxide semiconductor thin film in the photoresist-removed area.

Step S25, removing the photoresist in the photoresist-half-remained area by using an ashing process.

Step S26, removing the ESL thin film in the photoresist-half-remained area by using an etching process to form a pattern of the ESL.

Step S27, peeling off the photoresist in the photoresist-totally-remained area to form the ESL and the active layer.

The active layers formed in the above embodiments include: at least one first active portion, and the second active portion and the third active portion which are located on both sides of the first active portion and connected to the first active portion. The at least one first active portion is overlaid by the ESL, and the longitudinal width of the at least one first active portion is less than those/that of the second active portion and/or the third active portion. The first active portion is not located on areas corresponding to the source electrode and the drain electrode; the second active portion is located on an area corresponding to the source electrode; and the third active portion is located on an area corresponding to the drain electrode. The second active portion and the third active portion are partially overlaid by a horizontally-extending portion of the ESL on the first active portion. When the longitudinal width of the first active portion is less than that of the second active portion, the side wing contact is formed between the second active portion and the source electrode; and when the longitudinal width of the first active portion is less than that of the third active portion, the side wing contact is formed between the third active portion and the drain electrode.

In addition, the active layer may further include a fourth active portion which is not overlaid by the ESL and does not correspond to the source electrode and the drain electrode. The fourth active portion of the active layer can be etched in the process of forming the source/drain electrode subsequently.

Further, a single patterning process is used in the step of forming the source electrode and the drain electrode.

The step of forming the source electrode and drain electrode by using the single patterning process may specifically include:

Step S31, forming a source/drain electrode metal thin film on the active layer and the ESL.

Step S32, coating a photoresist on the source/drain electrode metal thin film.

Step S33, exposing and developing the photoresist on the source/drain electrode metal thin film to form a photoresist-remained area corresponding to source/drain electrode pattern areas and a photoresist-removed area which is an area except the photoresist-remained area.

Step S34, removing the source/drain electrode metal thin film in the photoresist-removed area and the fourth active portion of the active layer by using an etching process, to form patterns of the source electrode, drain electrode and the active layer. The fourth active portion of the active layer refers to a portion which is not overlaid by the ESL and not overlaid by the source electrode and the drain electrode.

Step S35, peeling off the photoresist in the photoresist-remained area, to form the source electrode and the drain electrode.

Since the active layer may be easily etched by the etchant, a single etching method may be used during etching the metal at the source/drain electrode. At the same time, the fourth active portion of the active layer which is not overlaid is etched off.

Alternatively, the fourth active portion of the above active layer may not be etched during the process of forming the source/drain electrode, but be etched separately after forming the source/drain electrode. Alternatively, the fourth active portion may be converted into an insulator through a converting process, without being etched.

Further, in order to protect the oxide TFT, the above manufacturing method may further include: forming a passivation layer (PVX) on the source electrode and the drain electrode.

Figure 16A:
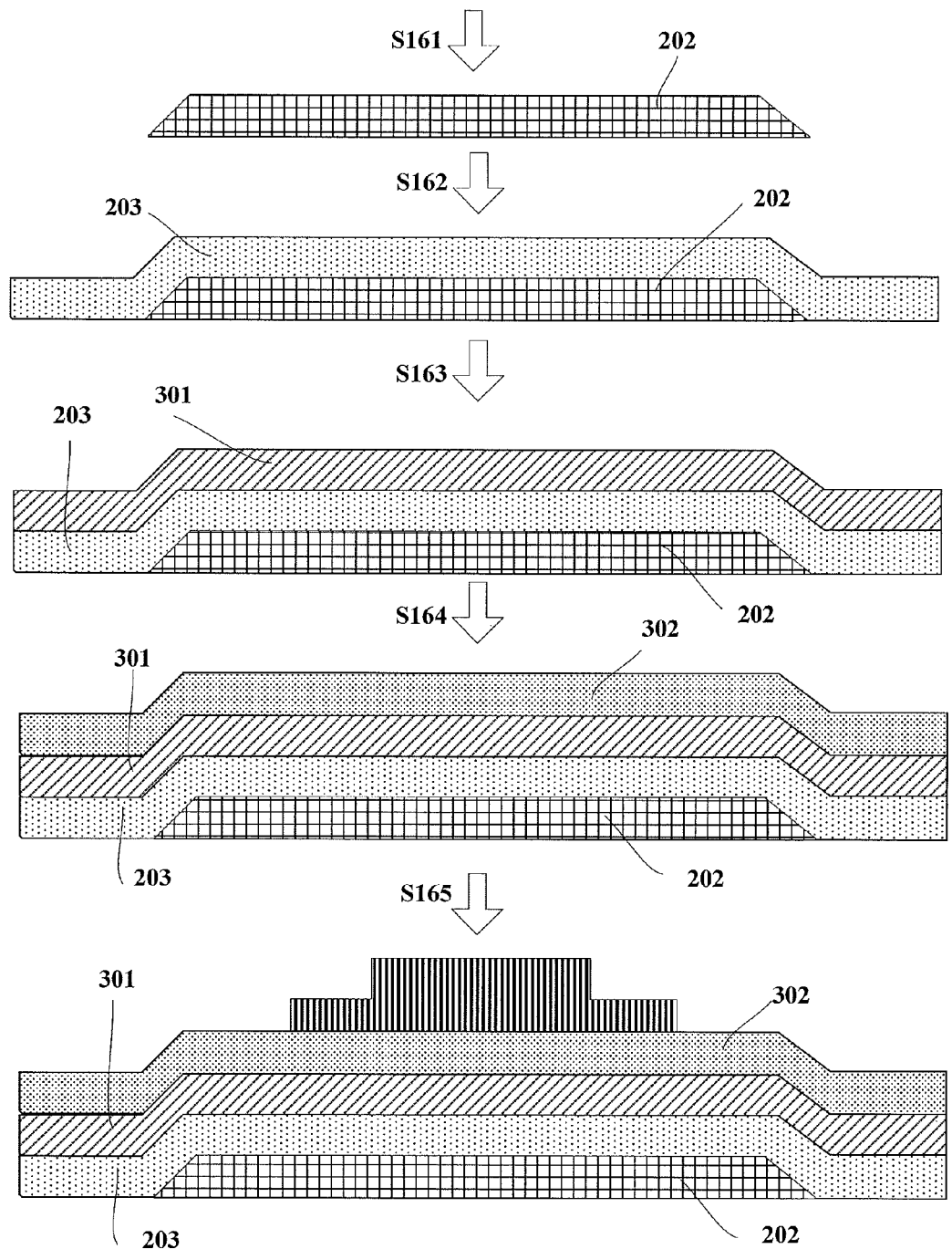
FIGS. 16A-16C are diagrams showing a process of a method for manufacturing a TFT according to an embodiment of the present disclosure.
Figure 16B:
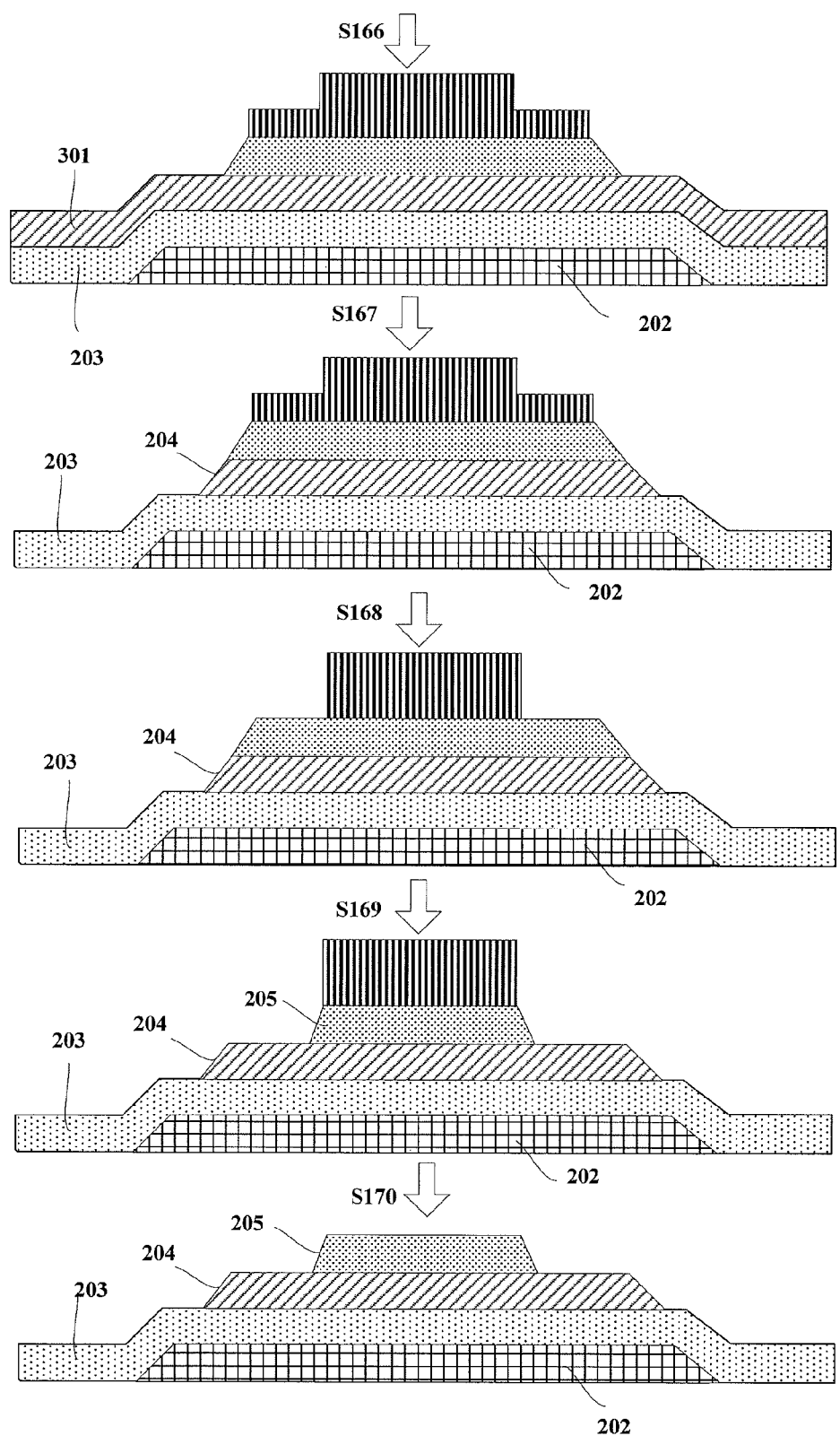
Figure 16C:
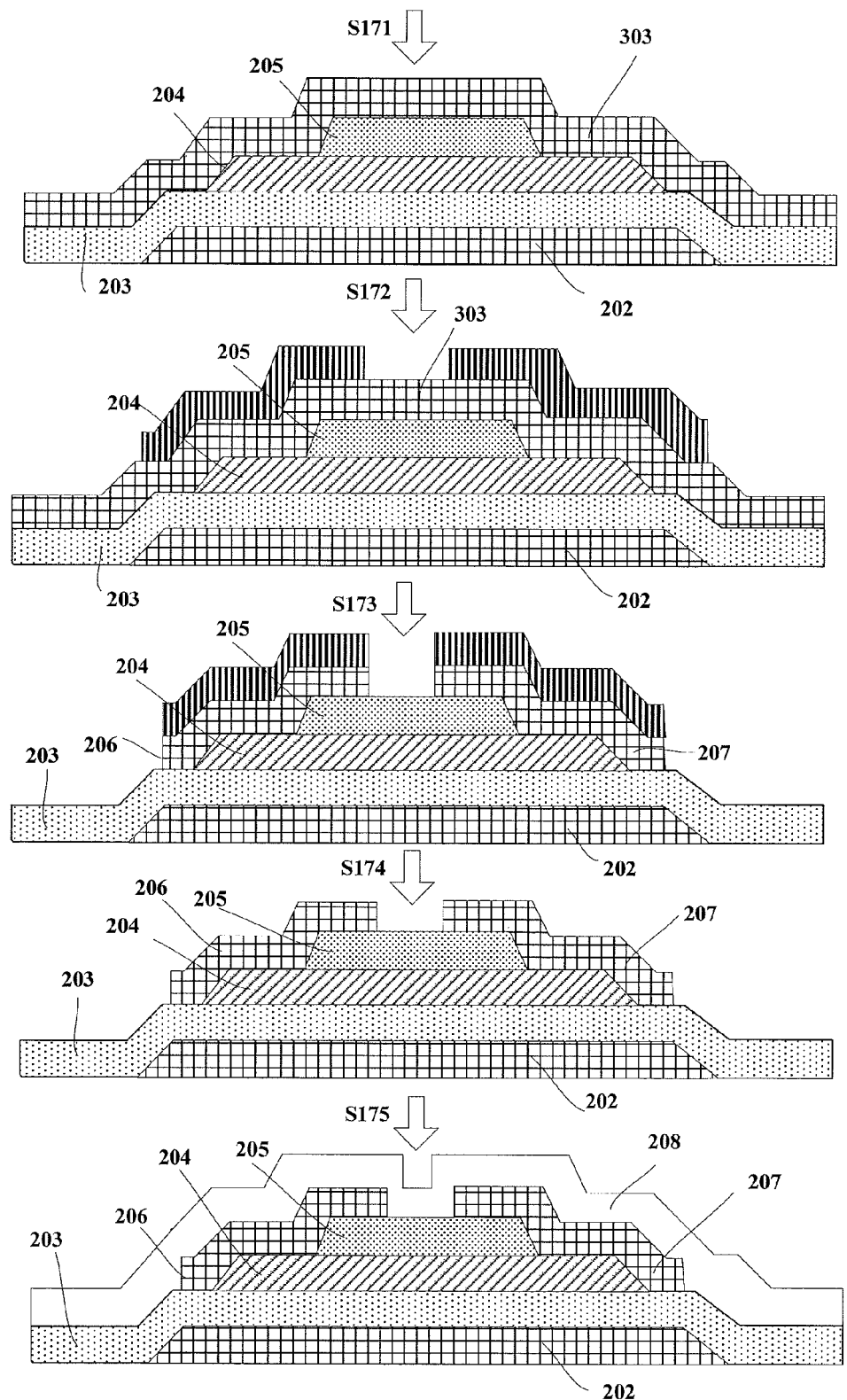

FIGS. 16A-16C are diagrams showing a process of the method for manufacturing the oxide TFT. The method includes the following steps:

Step S161, forming a gate electrode 202 through a single patterning process.

Step S162, forming a gate insulating layer 203 on the gate electrode 202.

Specifically, a depositing method may be used in the step of forming the gate insulating layer 203.

Step S163, forming a metal oxide semiconductor thin film 301 on the gate insulating layer 203.

The oxide semiconductor thin film may be made of IGZO, ITO or IZO and the like.

Specifically, a depositing method may be used in the step of forming the metal oxide semiconductor thin film 301.

Step S164, forming an ESL thin film 302 on the metal oxide semiconductor thin film 301.

Specifically, a depositing method may be used in the step of forming the ESL thin film 302.

Step S165, coating a photoresist on the ESL thin film 302 and exposing and developing the photoresist by using a halftone mask plate to form a photoresist-totally-remained area, a photoresist-half-remained area and a photoresist-removed area. Here, the photoresist-totally-remained area corresponds to an ESL pattern area, the photoresist-half-remained area corresponds to an area other than the ESL pattern area on the active layer, and the photoresist-removed area corresponds to an area other than the photoresist-totally-remained area and the photoresist-half-remained area.

Figure 17:
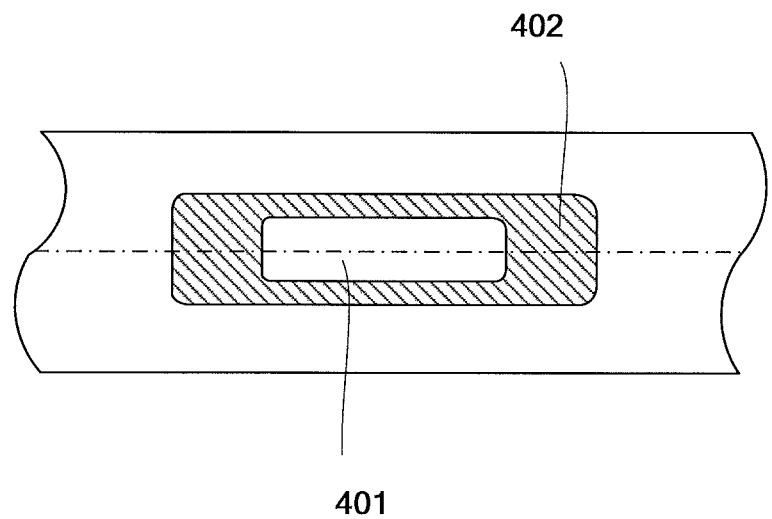
FIG. 17 is a diagram showing a pattern of a photoresist formed after exposing and developing the photoresist by using a halftone mask plate shown in FIGS. 16A-16C.

FIG. 17 is a diagram showing a pattern of a photoresist formed in Step S165 after exposing and developing the photoresist by using a halftone mask plate. In FIG. 17, the reference number 401 is referred to the photoresist in the photoresist-totally-remained area, while the reference number 402 is referred to the photoresist in the photoresist-half-remained area.

Step S166, removing the ESL thin film in the photoresist-removed area by using an etching process.

Specifically, a dry etch process may be used in the step of removing the ESL thin film in the photoresist-removed area.

Step S167, removing the metal oxide semiconductor thin film in the photoresist-removed area by using an etching process to form the active layer 204.

Specifically, a wet etch process may be used in the step of removing the metal oxide semiconductor thin film in the photoresist-removed area.

Step S168, removing the photoresist in the photoresist-half-remained area by using an ashing process.

Step S169, removing the ESL thin film in the photoresist-half-remained area by using an etching process to form a pattern of the ESL 205.

Step S170, peeling off the photoresist in the photoresist-totally-remained area to form the ESL 205 and the active layer 204.

The active layers 204 formed in the above embodiments include: at least one first active portion, and the second active portion and the third active portion which are located on both sides of the first active portion and connected to the first active portion. The at least one first active portion is overlaid by the ESL, and the longitudinal width of the at least one first active portion is less than those/that of the second active portion and/or the third active portion. The first active portion is not located on areas corresponding to the source electrode and the drain electrode; the second active portion is located on an area corresponding to the source electrode; and the third active portion is located on an area corresponding to the drain electrode. The second active portion and the third active portion are partially overlaid by a horizontally-extending portion of the ESL on the first active portion. When the longitudinal width of the first active portion is less than that of the second active portion, the side wing contact is formed between the second active portion and the source electrode; and when the longitudinal width of the first active portion is less than that of the third active portion, the side wing contact is formed between the third active portion and the drain electrode.

Step S171, forming a source/drain electrode metal thin film 303 on the active layer 204 and the ESL 205.

Step S172, coating a photoresist on the source/drain electrode metal thin film 303, and exposing and developing the photoresist on the source/drain electrode metal thin film 303 to form the photoresist-remained area corresponding to the source/drain electrode pattern area and the photoresist-removed area other than the photoresist-remained area.

Step S173, removing the source/drain electrode metal thin film in the photoresist-removed area and the fourth active portion of the active layer by using an etching process to form patterns of the source electrode 206, the drain electrode 207 and the active layer 204. Here, the fourth active portion of the active layer refers to a portion which is not overlaid by the ESL 205 and not located on the active portion of the source electrode and the drain electrode area.

Step S174, peeling off the photoresist in the photoresist-remained area, to form the source electrode 206 and the drain electrode 207.

Step S175, forming a passivation layer 208 on the source electrode 206 and the drain electrode 207.

The oxide TFT as shown in FIG. 7 may be manufactured by using the halftone mask plate as shown in FIG. 17.

Figure 18:
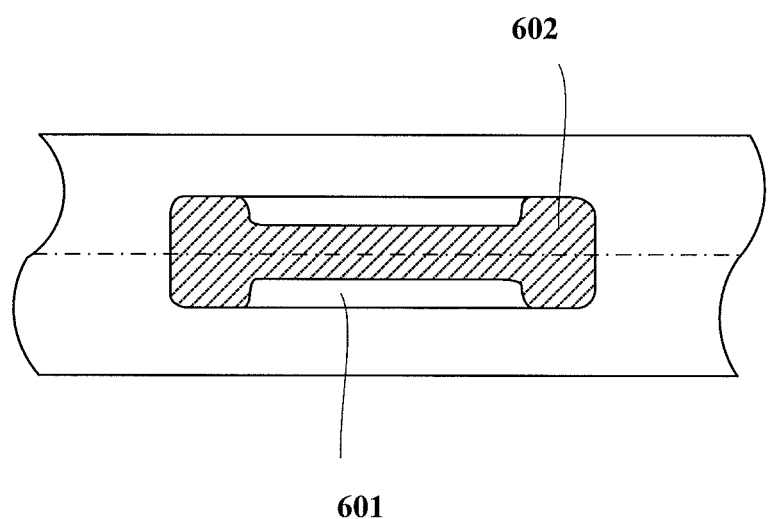
FIG. 18 is a diagram showing a pattern of a photoresist formed after exposing and developing the photoresist by using a halftone mask plate according to another embodiment of the present disclosure.

In Step S165 of the above embodiment, other types of halftone mask plates may be used to expose the photoresist. FIG. 18 is a diagram showing a pattern of a photoresist formed after exposing and developing the photoresist by using a halftone mask plate according to another embodiment of the present disclosure. Here, the reference number 601 is referred to the photoresist in the photoresist-totally-remained area, while the reference number 602 is referred to the photoresist in the photoresist-half-remained area. The oxide TFT as shown in FIG. 11 may be manufactured by using the halftone mask plate as shown in FIG. 18.

In the above embodiments, the active layer may be made of a metal oxide semiconductor material or monocrystalline silicon (a-si), polysilicon and other materials.

In the above embodiments, the channel length of the formed oxide TFT is in a range of 2-20 μm, preferably about 4 μm. For the thin channel formed like above, the Ion Current can be improved by about 3 times in a condition of being of a same size.

The above is only preferred embodiments of the present disclosure, it should be noted that several improvements and modifications may be made for a person skilled in the art without departing from the principle of the present disclosure, and also should be considered to fall within the protection scope of the present disclosure.

What is claimed is:

1. An oxide thin film transistor (TFT) comprising: an active layer, an etch stop layer (ESL), a source electrode, and a drain electrode, wherein
    the active layer comprises: at least one first active portion, a second active portion and a third active portion located on both sides of the first active portion and connected to the first active portion;
    the at least one first active portion is overlaid by the ESL,
    the second active portion and the third active portion are partially overlaid by the ESL on the first active portion;
    the second active portion comprises: a first overlay portion that is overlaid by the ESL, and a first contact portion that is not overlaid by the ESL, wherein a first direct contact is formed between the second active portion and the source electrode through the first contact portion; and
    the third active portion comprises: a second overlay portion overlaid by the ESL, and a second contact portion that is not overlaid by the ESL, wherein a second direct contact is formed between the third active portion and the drain electrode through the second contact portion.

2. The oxide thin film transistor according to claim 1, wherein
    when a longitudinal width of the first active portion is less than that of the second active portion, the first direct contact is formed between two sides of the second active portion in a longitudinal direction and the source electrode; and
    when the longitudinal width of the first active portion is less than that of the third active portion, the second direct contact is formed between two sides of the third active portion in the longitudinal direction and the drain electrode,
    wherein the longitudinal direction is referred to as a direction perpendicular to a connection direction between a center of the source electrode and that of the drain electrode.

3. The oxide thin film transistor according to claim 2, wherein
    when the first direct contact is formed between the second active portion and the source electrode, the second active portion comprises: a first overlay portion that is overlaid by the ESL, and a first contact portion that is not overlaid by the ESL and located in a longitudinal direction of the first overlay portion, wherein the first direct contact is formed between the second active portion and the source electrode through the first contact portion; and
    when the second direct contact is formed between the third active portion and the drain electrode, the third active portion comprises: a second overlay portion overlaid by the ESL, and a second contact portion that is not overlaid by the ESL and located in a longitudinal direction of the second overlay portion, wherein the second direct contact is formed between the third active portion and the drain electrode through the second contact portion.

4. The oxide thin film transistor according to claim 3, wherein
the second active portion further comprises: an extending portion that is not overlaid by the ESL and located in a horizontal direction of the first overlay portion,
wherein the horizontal direction is referred to as the connection direction between the center of the source electrode and that of the drain electrode.

5. The oxide thin film transistor according to claim 3, wherein
the third active portion further comprises: an extending portion that is not overlaid by the ESL and located in a horizontal direction of the second overlay portion,
wherein the horizontal direction is referred to as the connection direction between the center of the source electrode and that of the drain electrode.

6. The oxide thin film transistor according to claim 1, wherein
when the active layer comprises one first active portion, the first active portion is located at an intermediate position of an area between the second active portion and the third active portion.

7. The oxide thin film transistor according to claim 3, wherein
when the first direct contact is formed between the second active portion and the source electrode, the second active portion comprises two first contact portions and one first overlay portion, wherein the two first contact portions are located on both sides of the first overlay portion; and
when the second direct contact is formed between the third active portion and the drain electrode, the third active portion comprises two second contact portions and one second overlay portion, wherein the two second contact portions are located on both sides of the second overlay portion.

8. The oxide thin film transistor according to claim 1, wherein
when the active layer comprises two first active portions, the two first active portions are located on both upper and lower sides of an area between the second active portion and the third active portion in a longitudinal direction,
wherein the longitudinal direction is referred to as a direction perpendicular to a connection direction between a center of the source electrode and that of the drain electrode.

9. The oxide thin film transistor according to claim 3, wherein
when the first direct contact is formed between the second active portion and the source electrode, the second active portion comprises one first contact portion and two first overlay portions, wherein the first contact portion is located between the two first overlay portions; and
when the second direct contact is formed between the third active portion and the drain electrode, the second active portion comprises one second contact portion and two second overlay portions, wherein the second contact portion is located between the two second overlay portions.

10. The oxide thin film transistor according to claim 1, further comprising: a gate electrode and a gate insulating layer overlaid on the gate electrode; and
wherein the active layer is formed on the gate insulating layer.

11. The oxide thin film transistor according to claim 1, further comprising a passivation layer; and
wherein the passivation layer is formed on the source electrode and the drain electrode.

12. The oxide thin film transistor according to claim 1, wherein the active layer is made of a metal oxide semiconductor material.

13. The oxide thin film transistor according to claim 1, wherein shapes of the second active portion and the third active portion are rectangular, circular or oval.

14. A method for manufacturing an oxide thin film transistor (TFT), the TFT comprising: an active layer, an etch stop layer (ESL), a source electrode and a drain electrode, wherein
the active layer comprises: at least one first active portion, a second active portion and a third active portion located on both sides of the first active portion and connected to the first active portion;
the at least one first active portion is overlaid by the ESL,
the second active portion and the third active portion are partially overlaid by the ESL on the first active portion;
the second active portion comprises: a first overlay portion that is overlaid by the ESL, and a first contact portion that is not overlaid by the ESL, wherein a first direct contact is formed between the second active portion and the source electrode through the first contact portion; and
the third active portion comprises: a second overlay portion overlaid by the ESL, and a second contact portion that is not overlaid by the ESL, wherein a second direct contact is formed between the third active portion and the drain electrode through the second contact portion,
the method comprising:
forming the active layer and the ESL; and
forming the source electrode and the drain electrode.

15. The method according to claim 14, wherein
the first direct contact is formed between two sides of the second active portion in a longitudinal direction and the source electrode, when a longitudinal width of the first active portion is less than that of the second active portion; and
the second direct contact is formed between two sides of the third active portion in the longitudinal direction and the drain electrode, when the longitudinal width of the first active portion is less than that of the third active portion.

16. The method according to claim 14, wherein
a single patterning process is used in the step of forming the active layer and the ESL.

17. The method according to claim 16, wherein
the step of forming the active layer and the ESL by using the single patterning process comprises:
forming a metal oxide semiconductor thin film and an ESL thin film;
coating a photoresist on the ESL thin film;
exposing and developing the photoresist by using a halftone mask plate to form a photoresist-totally-remained area, a photoresist-half-remained area and a photoresist-removed area, wherein the photoresist-totally-remained area corresponds to an ESL pattern area, the photoresist-half-remained area corresponds to an area other than the ESL pattern area on the active layer, and the photoresist-removed area corresponds to an area other than the photoresist-totally-remained area and the photoresist-half-remained area;

removing the ESL thin film and the metal oxide semiconductor thin film in the photoresist-removed area by using an etching process, to form the active layer;

removing the photoresist in the photoresist-half-remained area by using an ashing process;

removing the ESL thin film in the photoresist-half-remained area by using an etching process to form a pattern of the ESL; and peeling off the photoresist in the photoresist-totally-remained area to form the ESL and the active layer.

18. The method according to claim 14, wherein a single patterning process is used in the step of forming the source electrode and the drain electrode.

19. The method according to claim 18, wherein the step of forming the source electrode and drain electrode by using the single patterning process comprises:

forming a source/drain electrode metal thin film on the active layer and the ESL;

coating a photoresist on the source/drain electrode metal thin film;

exposing and developing the photoresist on the source/drain electrode metal thin film to form a photoresist-remained area corresponding to source/drain electrode pattern areas and a photoresist-removed area that is an area except the photoresist-remained area;

removing the source/drain electrode metal thin film in the photoresist-removed area and a fourth active portion of the active layer by using an etching process, to form patterns of the source electrode, drain electrode and the active layer; wherein the fourth active portion of the active layer refers to a portion that is not overlaid by the ESL and not overlaid by the source electrode and the drain electrode; and peeling off the photoresist in the photoresist-remained area, to form the source electrode and the drain electrode.

20. A display device comprising a base substrate and oxide thin film transistors (TFTs) that are formed on the base substrate, wherein each of the oxide thin film transistors comprises: an active layer, an etch stop layer (ESL), a source electrode and a drain electrode, wherein the active layer comprises: at least one first active portion, a second active portion and a third active portion located on both sides of the first active portion and connected to the first active portion;

the at least one first active portion is overlaid by the ESL, the second active portion and the third active portion are partially overlaid by the ESL on the first active portion;

the second active portion comprises: a first overlay portion that is overlaid by the ESL, and a first contact portion that is not overlaid by the ESL, wherein a first direct contact is formed between the second active portion and the source electrode through the first contact portion; and the third active portion comprises: a second overlay portion overlaid by the ESL, and a second contact portion that is not overlaid by the ESL, wherein a second direct contact is formed between the third active portion and the drain electrode through the second contact portion.

* * * * *